United States Patent [19]

Meador

[11] Patent Number: 4,469,022

[45] Date of Patent: Sep. 4, 1984

[54] APPARATUS AND METHOD FOR DECORATING ARTICLES OF NON-CIRCULAR CROSS-SECTION

[75] Inventor: Neil A. Meador, Montvale, N.J.

[73] Assignee: Permanent Label Corporation, Clifton, N.J.

[21] Appl. No.: 481,308

[22] Filed: Apr. 1, 1983

[51] Int. Cl.³ ............................................. B41F 17/08
[52] U.S. Cl. ................................. 101/38 R; 101/126; 101/129; 364/167
[58] Field of Search ...................... 101/38 R, 38 A, 39, 101/40, 35, 126, 129; 409/80, 127, 128; 364/167

[56] References Cited

U.S. PATENT DOCUMENTS

| | | | |
|---|---|---|---|
| 3,247,786 | 4/1966 | Heyne et al. | 01/38 R |
| 3,970,831 | 7/1976 | Hegyi | 364/167 X |
| 4,057,893 | 11/1977 | Smith et al. | 409/80 X |

Primary Examiner—Clifford D. Crowder
Attorney, Agent, or Firm—Samuelson & Jacob

[57] ABSTRACT

Apparatus and method for decorating the surface of an article having a non-circular cross-sectional configuration in which the article is positioned relative to an applicator to maintain the proper relative position and appropriate relative velocity for the application of a decorating medium throughout a decorating cycle in accordance with information pertaining to the cross-sectional configuration of the article and obtained from the surface contour of the article itself.

16 Claims, 16 Drawing Figures

APPARATUS AND METHOD FOR DECORATING ARTICLES OF NON-CIRCULAR CROSS-SECTION

The present invention relates generally to decorating articles, such as bottles and other containers, and pertains, more specifically, to printing, labelling or otherwise applying a decorating medium to the external surface of such an article when the article has a non-circular cross-sectional configuration.

The current marketplace exhibits an almost endless variety of products offered in a myriad of containers of different shapes and sizes, all requiring decoration of one kind or another to catch the eye of a purchaser. Machines and methods have been developed in attempts to cope with the requirements for printing or otherwise applying decorative as well as textual material to such containers; however, currently available machines and methods are somewhat limited in the ability to handle a wide variety of shapes and sizes economically.

For example, article decorating apparatus and method are disclosed in U.S. Pat. No. 3,247,786 to Heyne et al for decorating the external surface of containers having a non-circular cross-sectional configuration. The Heyne et al apparatus relies upon specially contoured gears and cams which must be provided for each particular cross-sectional configuration, thereby reducing the economy and flexibility of handling a wide variety of shapes and sizes with a single machine. Likewise, the apparatus disclosed in U.S. Pat. No. 3,249,043 to Karlyn et al, which can decorate certain non-circular surface contours, also relies upon individualized mechanical components, such as gears and levers, which are specifically tailored to each surface contour to be decorated. The expense involved in fabricating the specially shaped component parts necessary to operate these machines successfully tends to limit the machines to large production runs of each shape to be decorated, and reduces the variety of shapes which can be decorated. Additionally, the fixed nature of the specially contoured component parts requires that the articles to be decorated not vary in surface contour from batch to batch, thereby setting more stringent standards for dimensional consistency in the production of the articles themselves. Furthermore, some desirable article shapes and sizes just are not amenable to decoration in such machines since the mechanical components cannot be tailored to the complex shapes required.

It is an object of the present invention to provide apparatus and method by which the external surface of articles having a wide variety of non-circular cross-sectional configurations may be decorated with increased ease and economy.

Another object of the invention is to provide apparatus and method in which the external surface contour of a particular article to be decorated itself may be utilized to set up the apparatus for decorating that surface contour.

Still another object of the invention is to provide apparatus and method for decorating the external surface of articles even where the external surface follows no particular regular mathematical shape and may have an unusual configuration.

Yet another object of the invention is to provide apparatus and method for decorating the external surface of containers and like articles having a non-circular cross-sectional configuration and which will do so economically, even for short production runs, with minimal set-up time and maximum flexibility in the variety of shapes and sizes to be accommodated.

A further object of the invention is to provide apparatus and method for decorating the external surface of an article, and in which the contour of the surface first is detected to provide information for operating the apparatus to apply a decorating medium to articles of like surface contour.

A still further object of the invention is to provide apparatus and method for decorating the external surface of an article of non-circular cross-sectional configuration and which enables automatic conformation to almost any selected surface contour to be decorated, with minimal operator skill.

Yet a further object of the invention is to provide apparatus and method for decorating the external surface of an article of non-circular cross-sectional configuration with increased ease and consistent high quality.

The above objects, as well as still further objects and advantages, are attained by the present invention which may be described briefly as apparatus for decorating the surface of an article having a non-circular cross-sectional configuration, the apparatus including an applicator having a surface for applying a decorating medium to the article surface at a given location in the apparatus, at which given location the applicator surface and the article surface are maintained in proper relative position and appropriate relative velocity for the application of the decorating medium throughout a decorating cycle of operation, the apparatus comprising: positioning means for positioning the article and the applicator at successive positions relative to one another during the decorating cycle such that successive portions of the article surface will be placed in the proper relative position and at the appropriate relative velocity with corresponding successive portions of the applicator surface, at the given location, throughout the decorating cycle, the positioning means including article drive means for advancing the successive portions of the article surface through the given location, and applicator drive means for advancing the successive portions of the applicator surface through the given location, during the decorating cycle; article-configuration information means for providing information pertaining to the successive positions of the article at which the successive portions of the article surface are placed in the proper relative position at the given location, based upon the cross-sectional configuration of the article, and for identifying the condition of the positioning means when the article is at each of the successive positions so as to provide article-configuration information pertaining to the condition of the positioning means as determined by the cross-sectional configuration of the article; information processing means for receiving the article-configuration information from the article-configuration information means and for providing operating information for actuation of the positioning means; and actuating means for actuating the positioning means in accordance with the operating information provided by the information processing means to actuate the article drive means and the applicator drive means such that the proper relative position and the appropriate relative velocity are maintained between the article surface and the applicator surface, at the given location, throughout the decorating cycle. The article-configuration information may be supplied by detecting means for detecting the successive positions of the article at which the successive portions of the article surface are placed in the proper relative position at the given location, based upon the cross-sectional configuration of the article, and for determining the condition of the positioning means when the article is at each of the successive positions so as to provide article-configuration information pertaining to the condition of the positioning means as determined by the surface contour of the cross-sectional configuration of the article. Additionally, the invention includes the method of decorating the surface of an article having a non-circular cross-sectional configuration and utilizing an apparatus which includes an applicator having a surface for applying a decorating medium to the article surface at a given location in the apparatus, at which given location the applicator surface and the article surface are maintained in proper relative position and appropriate relative velocity for the application of the decorating medium throughout a decorating cycle of operation, the method comprising the steps of: positioning the article and the applicator at successive positions relative to one another such that successive portions of the article surface will be placed in the proper relative position with corresponding successive portions of the applicator surface, at the given location, for the decorating cycle; detecting the successive positions of the article at which the successive portions of the article surface are placed in the proper relative position at the given location, based upon the cross-sectional configuration of the article, to provide article-configuration information determined by the cross-sectional configuration of the article; and advancing the successive portions of the article surface and the successive portions of the applicator surface through the given location in accordance with the article-configuration information such that the proper relative position and the appropriate relative velocity are maintained between the article surface and the applicator surface, at the given location, throughout the decorating cycle. Alternately, the article-configuration information may be stored for selective subsequent use in advancing the successive portions of the article surface and the successive portions of the applicator surface throughout the decorating cycle.

The invention will be more fully understood, while still further objects and advantages will become apparent, in the following detailed description of a preferred embodiment of the invention illustrated in the accompanying drawing, in which.

Figure 1:
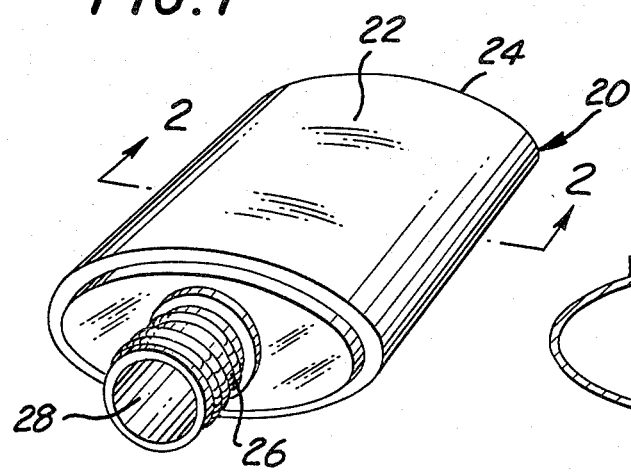
FIG. 1 is a perspective view of an article, in the form of a bottle, the surface of which is to be decorated in accordance with the invention.
Figure 2:
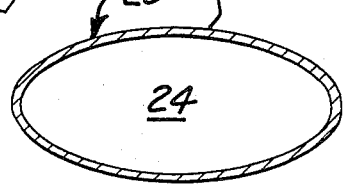
FIG. 2 is a cross-sectional view taken along line 2—2 of FIG. 1 to illustrate the cross-sectional configuration of the article.

Referring now to the drawing, and especially to FIGS. 1 and 2 thereof, an article to be decorated is shown in the form of a bottle 20 having a non-circular cross-sectional configuration, illustrated in FIG. 2 as being in the form of an ellipse. Bottle 20 is a typical example of the large variety of containers available for the packaging and sale of a myriad of products and illustrates only one of many available shapes. The outer surface 22 of bottle 20 is to be decorated, or labelled, to display artwork and text associated with the promotion of the product packaged in the bottle. The desire for attractive packaging leads to the need for versatile decorating techniques which will place a decorating medium along any selected portion of the outer surface 22 with accuracy and consistent high quality, regardless of the countour of the outer surface 22. Bottle 20 includes a closed base 24 and an opposite neck 26 having an open mouth 28.

Figure 3:
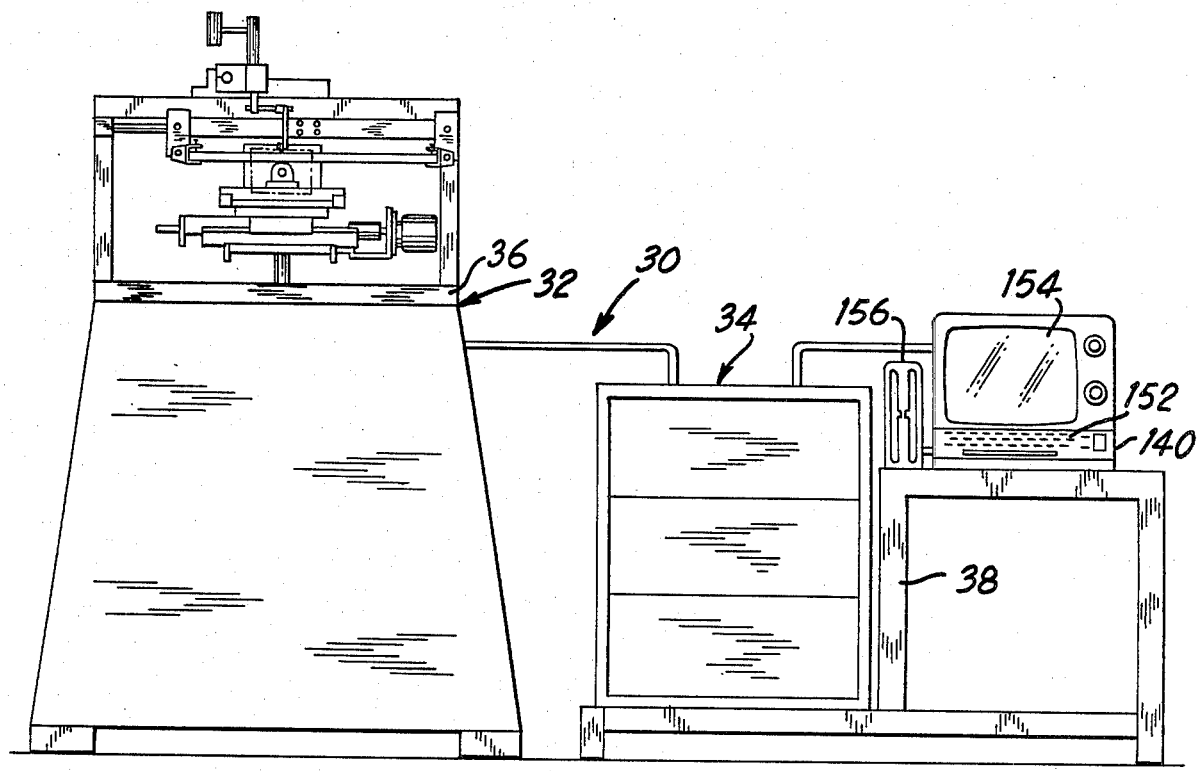
FIG. 3 is a front elevational view of an apparatus constructed in accordance with the invention.

Turning now to FIG. 3, an apparatus 30 is illustrated which is constructed in accordance with the present invention and carries out the method of the invention in decorating the outer surface of an article having a non-circular cross-sectional configuration, as illustrated by bottle 20. Apparatus 30 includes a printing machine 32, which will apply a decorating medium in the form of printing ink to the outer surface 22 of bottle 20, and a control arrangement 34, which will control the operation of the printing machine 32, as will be explained in detail below. Printing machine 32 includes a main frame 36 which carries the various mechanisms for accomplishing printing, while control arrangement 34 includes a control frame 38 upon which is carried a variety of controls.

Figure 4:
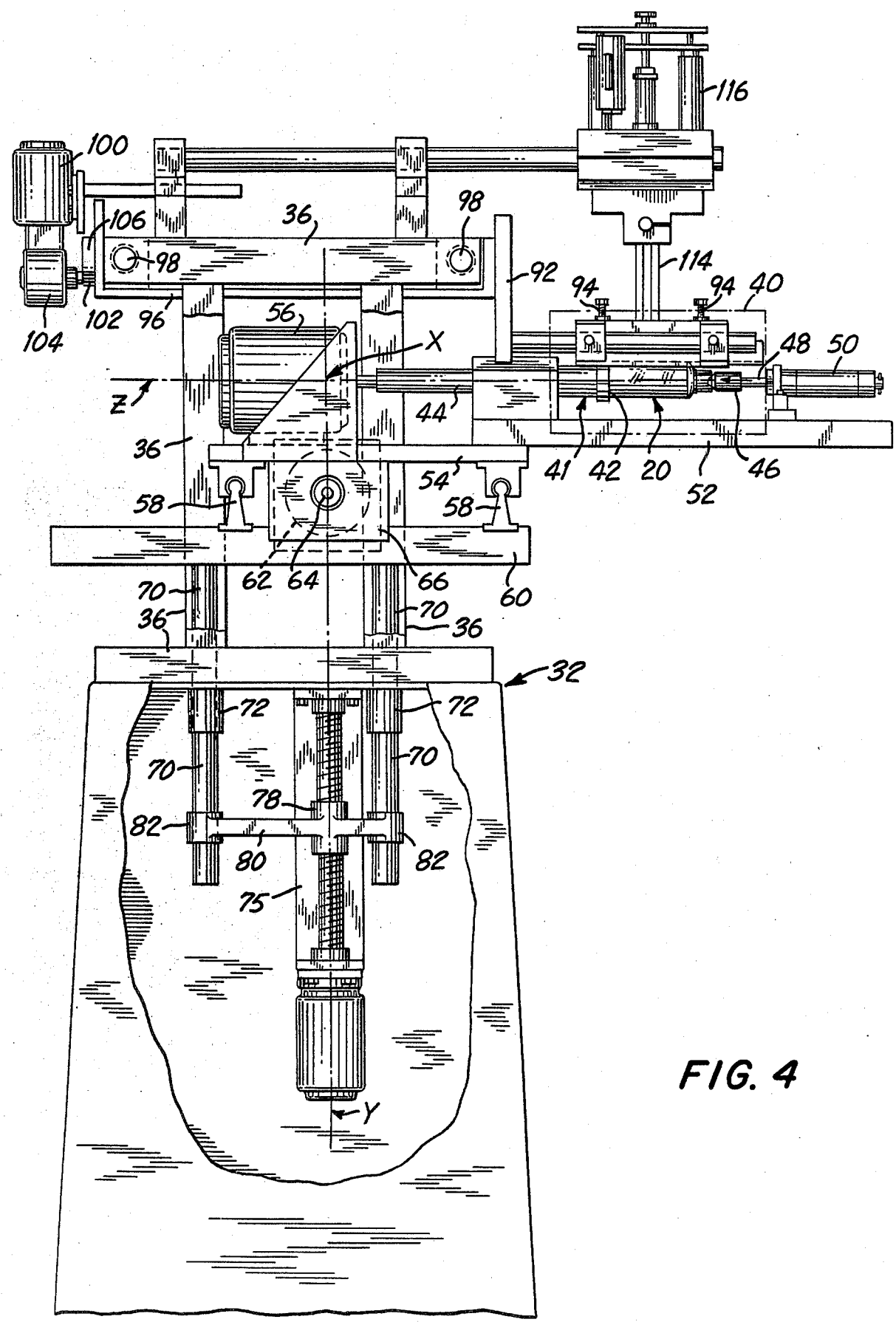
FIG. 4 is an enlarged side elevational view of a portion of the apparatus.
Figure 5:
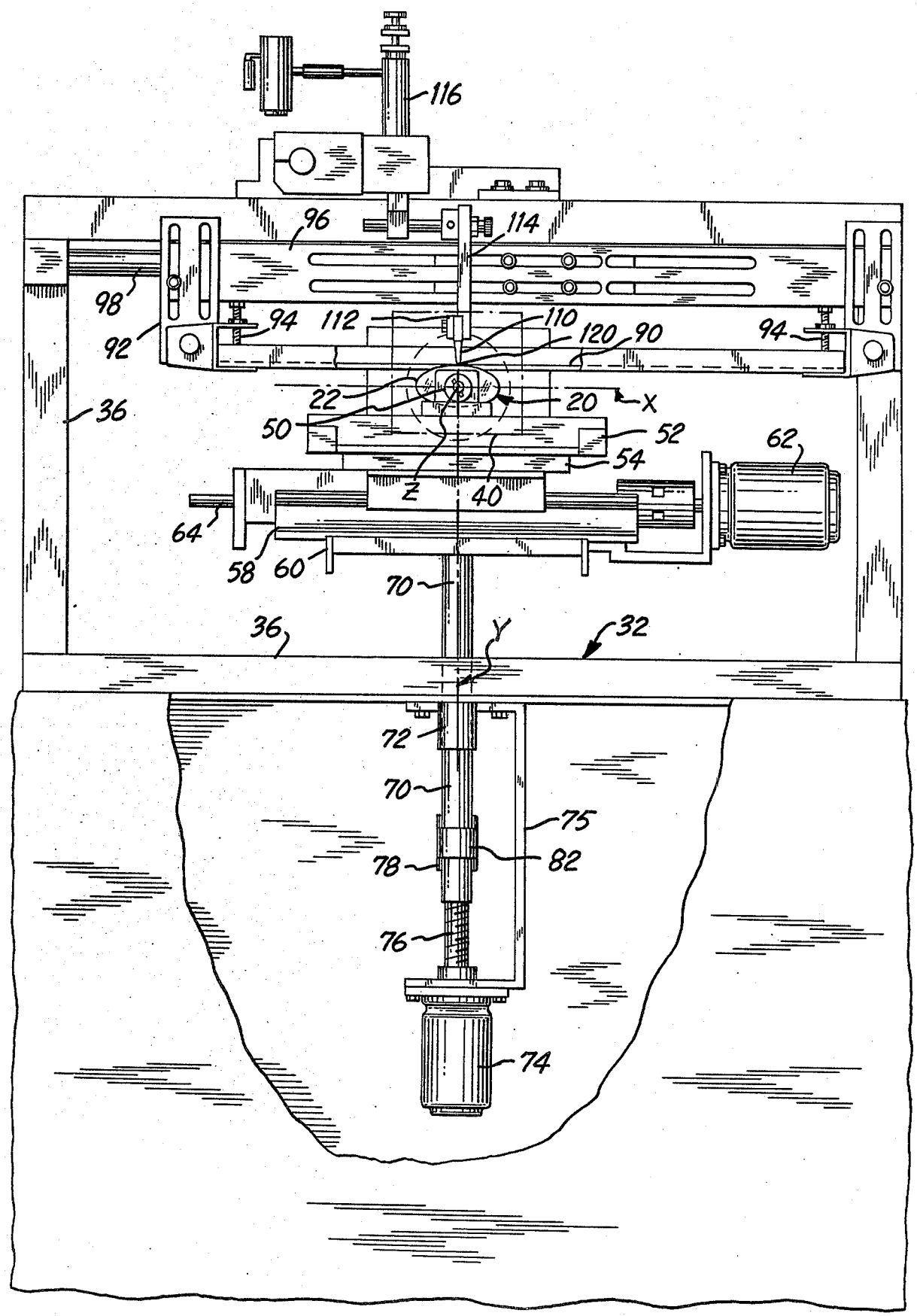
FIG. 5 is an enlarged front elevational view of the portion of the apparatus shown in FIG. 4.

Referring to FIGS. 4 and 5, as well as to FIG. 1, bottle 20 is placed within printing machine 32 at a given loction, designated as printing station 40, where there is located a chucking fixture 41 which includes a socket 42 carried by a spindle 44 for receiving the base 24 of bottle 20, and a tapered free center 46 carried by a rod 48 for entry into the open mouth 28 of the bottle 20. An actuator 50 selectively moves the rod 48 longitudinally, as indicated by the arrow thereon, to seat the center 46 within mouth 28 and thereby clamp the bottle 20 in place within the chucking fixture 41 at printing station 40.

Chucking fixture 41 is mounted upon a work table 52 which is integral with a carriage 54 which carries a first drive motor 56 coupled to the spindle 44 for rotation of the spindle 44, and consequently the bottle 20, about a longitudinal axis Z, the free center 46 being freely rotatable upon rod 48. Carriage 54 rides upon a pair of rails 58 secured to a platform 60 upon which there is mounted a second drive motor 62 coupled to a first lead screw 64 which extends through a follower 66 carried by carriage 54 such that actuation of the drive motor 62 will move the carriage 54 along rails 58 in the direction of a second axis X which is horizontal and perpendicular to longitudinal axis Z. Platform 60 itself is supported by a pair of vertical support shafts 70 slideably received within sleeves 72 fixed to frame 36 of printing machine 32. A third drive motor 74 is mounted upon frame 36 by means of a bracket 75 and is coupled to a second lead screw 76 which carries a follower 78 movable along the lead screw 76 in response to rotation of the lead screw 76. A yoke 80 is integral with follower 78 and is affixed to each support shaft 70 at collar 82 to couple the platform 60 for movement with the follower 78 upon rotation of lead screw 76 in response to actuation of drive motor 74. Movement of the platform 60 is along a direction parallel to a third axis Y which is vertical and perpendicular to axes Z and X. Thus, work table 52, and consequently bottle 20, is movable along orthogonal axes X and Y and bottle 20 is rotatable about axis Z which is perpendicular to axes X and Y.

In order to accomplish printing at the printing station 40, printing machine 32 employs a screen printing arrangement of the type well-known in the decoration of bottles. Thus, a framed screen 90 is secured to a subframe 92 by means of clamps 94 carried by a screen carriage 96 mounted for movement along a pair of guides 98 affixed to main frame 36 and extending parallel to the X axis. A further drive motor 100 is mounted upon the main frame 36 and drives a pinion gear 102, through a reduction gear train 104, which pinion gear 102 is meshed with a toothed rack 106 secured to the screen carriage 96 such that upon actuation of drive motor 100, screen carriage 96, and consequently screen 90, will move along directions parallel to the X axis, relative to the printing station 40. A squeegee 110 is held in a holder 112 affixed to a carrier rod 114 which is selectively moved downwardly or upwardly, into or out of printing relationship with screen 90, by means of an actuator assembly 116 carried by frame 36. Thus, printing is accomplished by the transfer of ink through the screen 90, assisted by the squeegee 110, to the bottle 20 at a point of transfer 120 in the printing station 40.

If bottle 20 had a circular cross-sectional configuration, printing could be accomplished merely by moving the screen 90 along the direction of the X axis while rotating the bottle about the Z axis in synchronism so that the surface of the screen 90, acting in conjunction with the surface of the squeegee 110, referred to as the applicator surface, and the outer surface 22 of bottle 20 are in proper relative position for the accurate registration of the printed matter and are in appropriate relative velocity for the accurate transfer of ink through the screen to the bottle; that is, the surface speeds and directions are matched to essentially eliminate relative velocity at point of transfer 120.

Figure 6:
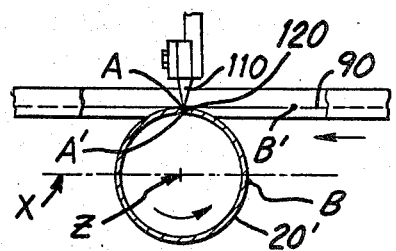
FIGS. 6 and 7 are diagrammatic illustrations of the basic principles of operation of a screen printing decorating operation.
Figure 7:
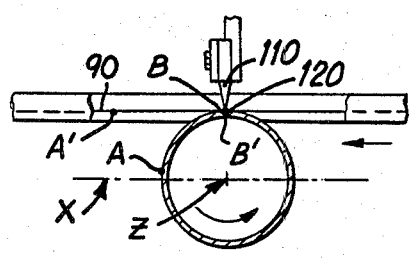

Thus, as shown diagrammatically in FIGS. 6 and 7, a bottle 20' of circular cross-section may be rotated about the Z axis in a counterclockwise direction while the screen 90 is moved in a direction from right to left, parallel to the X axis, and squeegee 110 remains stationary, to accomplish the transfer of ink, through screen 90, at the point of transfer 120. In order to accomplish the appropriate transfer of the decorating medium, the positions of the applicator surface and the article surface relative to one another, and the speed of those surfaces, must be such that contact is made at the point of transfer and there is essentially no relative velocity between the surfaces at the point of transfer. Hence, as the portion of the surface of bottle 20' between points A and B on the bottle surface is advanced through the point of transfer 120, a corresponding portion of the screen 90 between points A' and B' must be advanced through point of transfer 120, as illustrated. By keeping the speeds of the bottle surface and the screen essentially equal at point of transfer 120 and by keeping the screen tangent with the bottle surface at the point of transfer 120, the applicator surface and the article surface will be in proper relative position, and the relative velocity between the applicator surface and the article surface will be the appropriate essentially zero velocity. Since the radius between the Z axis and the point of transfer 120 is constant for the circular cross-section, and since the screen is planar, the positions and the speeds of the bottle 20' and screen 90 may be maintained at a given constant throughout the full decorating cycle. The above-described relationship between the applicator surface and the article surface necessary for accomplishing the appropriate transfer of the decorating medium holds true for applicators other than a screen, such as roller applicators of various radii, and screen 90 is shown as an example of a typical applicator.

Figure 8:
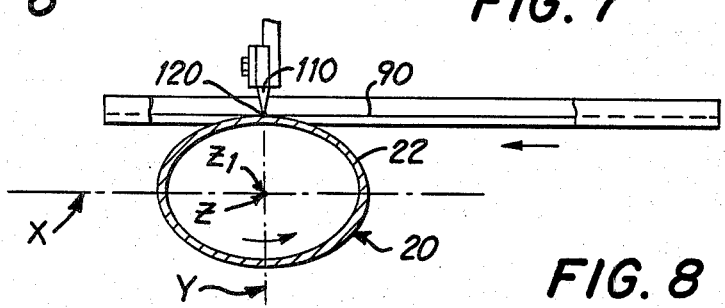
FIGS. 8 through 11 are diagrammatic illustrations of the principles of operation of the apparatus and method of the present invention in the printing mode of operation.
Figure 9:
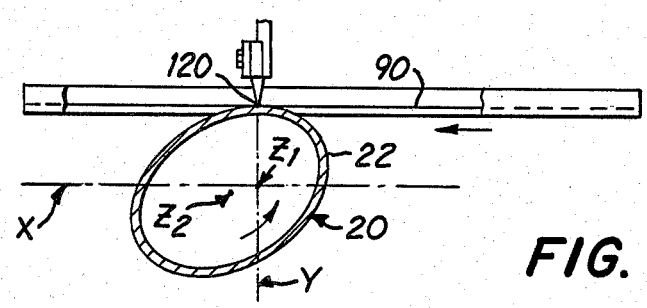
Figure 10:
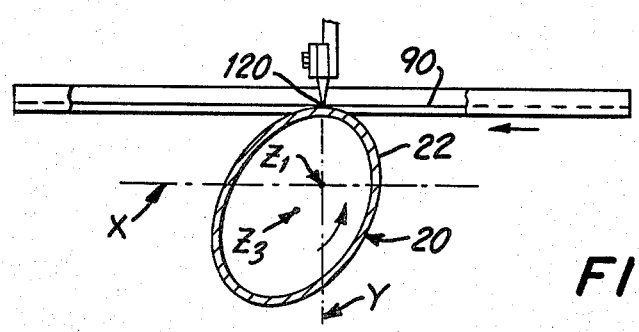
Figure 11:
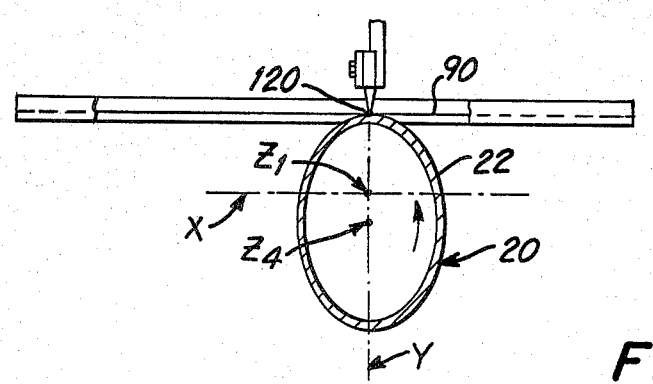

However, the cross-sectional configuration of bottle 20 is not circular and the attainment of the proper relative position of the applicator surface and the bottle surface at point of transfer 120, as well as the attainment of the appropriate relative velocity for the application of ink, requires lateral displacement of the Z axis of rotation of bottle 20, in the directions of the X and Y axes, in synchronism with rotation of the bottle 20 about the Z axis and movement of the screen 90. Thus, turning to FIGS. 8 through 11, there is illustrated diagrammatically a portion of the decorating cycle necessary to decorate the surface of the elliptical cross-sectional configuration of bottle 20. In FIG. 8, bottle 20 and screen 90 are shown at a starting or home position, with the squeegee 110 placed against screen 90 at the point of transfer 120. As bottle 20 is rotated in a counterclockwise direction about the Z axis, it becomes necessary to displace the Z axis downwardly and to the left of the original position $Z_1$ of the Z axis, to position $Z_2$, so that when the bottle 20 has been rotated to the position shown in FIG. 9, the bottle surface portion located at the point of transfer 120 still is tangent to the screen 90. Continued rotation of the bottle 20 about the Z axis requires further displacement of the Z axis to position $Z_3$, as illustrated in FIG. 10, to maintain the bottle surface tangent to the screen 90 at the point of transfer 120. Upon further rotation of bottle 20, the Z axis is displaced to position $Z_4$, still maintaining the bottle surface tangent to the screen at point of transfer 120, as seen in FIG. 11.

The diagrammatic illustrations of FIGS. 8 through 11 show one-quarter of a revolution of bottle 20, but the principles are the same for the remaining three-quarters of a revolution necessary to traverse the complete surface of the bottle and return the bottle to the starting or home position. The Z axis is moved in accordance with the configuration of the surface of the bottle to maintain the surface tangent to the screen at the point of transfer 120 regardless of the angular position of the bottle. At the same time, the speed of rotation of the bottle 20, together with the speed of translation of the Z axis along the X and Y axes, is regulated so that the speed of the portion of the bottle surface at point of transfer 120 essentially matches the speed of the screen 90 to attain essentially zero relative velocity at the point of transfer 120. Thus, for any chosen point along the bottle outer surface 22, there is a corresponding angular position of the bottle about the Z axis, relative to the home position, and there is a location of the Z axis which can be expressed in terms of the distances along the X and Y axes, relative to the location of the Z axis for assuring that the surface of the bottle is tangent to the screen 90 when the chosen point is at the point of transfer 120. Conversely, each angular position of the bottle 20 about the Z axis has a corresponding point on the outer surface 22 which when brought tangent to the screen 90 at point of transfer 120 will place the Z axis at a particular position relative to the X and Y axes. Likewise, there is a speed of movement of the chosen point which when appropriately matched to the speed of movement of screen 90 will attain essentially zero relative velocity.

Figure 12:
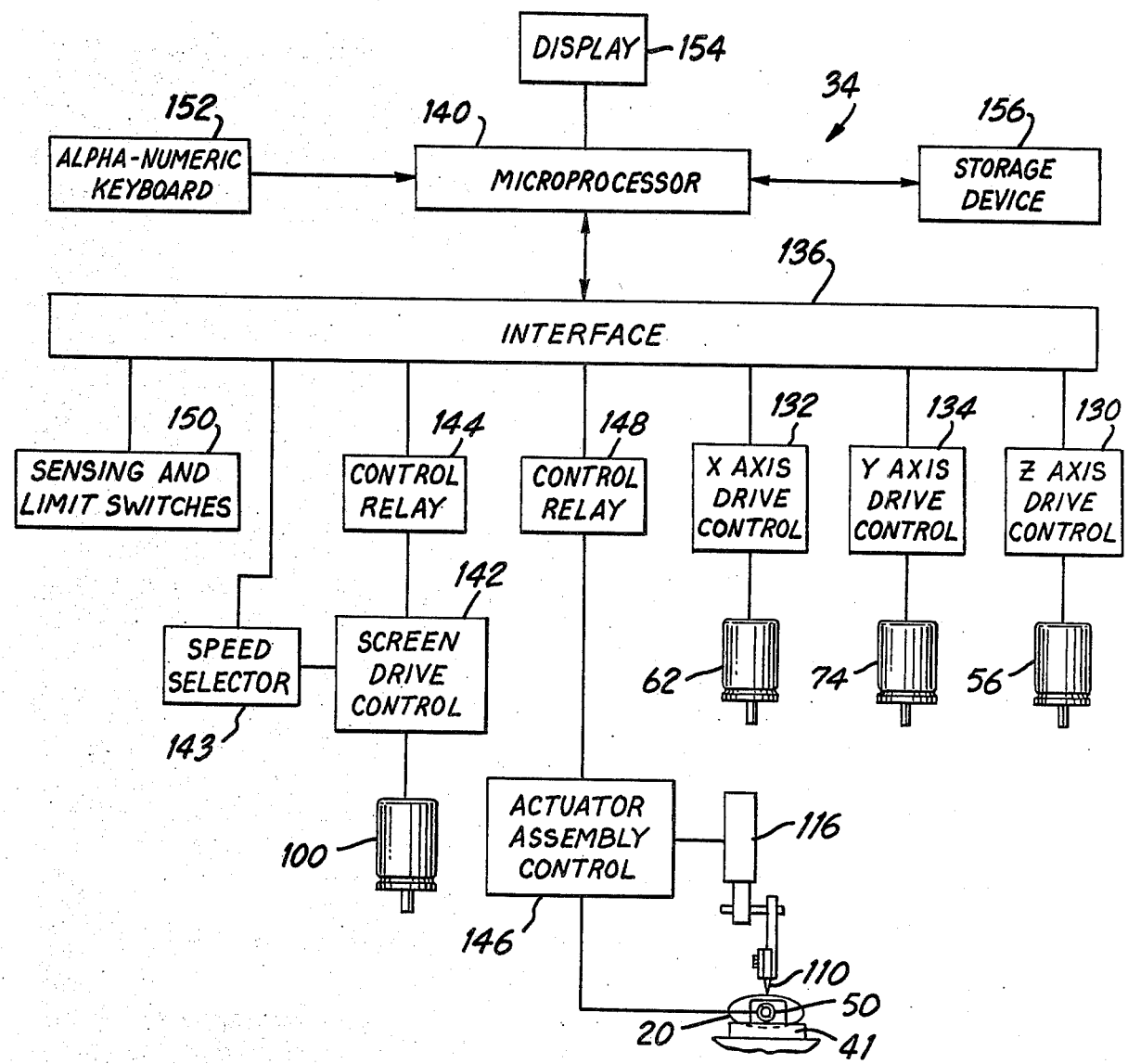
FIG. 12 is a schematic diagram of the control system of the apparatus.

As described in connection with FIGS. 3, 4 and 5, printing machine 32 enables movement of the Z axis along directions parallel to the X and Y axes, as well as rotation of the bottle about the Z axis; hence, information pertaining to the location of the Z axis and the speed of movement of the bottle surface at that location, expressed in terms of distances along the X and Y axes and the angular position around the Z axis, for points along the surface of the bottle, can be used to operate the printing machine 32 to accomplish the desired decoration of the surface of bottle 20. Turning now to FIG. 12, as well as to FIGS. 3, 4 and 5, a generally schematic diagram illustrates the operation of printing machine 32 by control arrangement 34. As described above, in connection with FIGS. 3, 4 and 5, bottle 20 is held in chucking fixture 41 with the outer surface 22 of the bottle 20 placed at the point of transfer 120. The screen 90 and squeegee 110 also are located at the point of transfer 120. The bottle 20 is rotated by the operation of drive motor 56. At the same time, the Z axis is translated laterally in directions parallel to the X and Y axes by operation of drive motors 62 and 74, respectively, to maintain the portion of outer surface 22 located at the point of transfer 120 tangent to the screen 90 and at essentially zero velocity relative to the screen 90 which itself is advanced simultaneously by the operation of drive motor 100. Thus, drive motors 56, 62 and 74 serve as positioning means to position the outer surface 22 of bottle 20 relative to the point of transfer 120.

As seen in FIG. 12, each drive motor 56, 62 and 74 is actuated by a corresponding drive control 130, 132 and 134, respectively, which, in turn, is interfaced through interface 136 with an information processing means in the form of microprocessor 140. Drive motor 110 is actuated by a drive control 142 which includes a speed selector 143 and which is connected to interface 136 through a control relay 144, while the actuator 50 of chucking fixture 41 and the actuator assembly 116 for squeegee 110 are operated by an actuator assembly control 146 connected to interface 136 through another control relay 148. Appropriate sensing and limit switches 150 are placed in suitable locations in printing machine 32 and connected to interface 136. An operator means, here shown in the form of an alpha-numeric keyboard 152, operates the microprocessor 140, and a display 154 may be provided to aid in the programming and operation of the microprocessor 140. A separate information storage device 156 may be utilized to store information to be utilized in the operation of the apparatus.

Microprocessor 140 is programmed to process information pertaining to the cross-sectional configuration of the bottle 20 and information pertaining to the condition of the positioning means which positions the bottle 20 relative to the screen 90 at the point of transfer 120 so as to provide operating information to the positioning means, which operating information enables the positioning means to maintain the proper relative position and the appropriate relative velocity between the bottle surface 22 and the screen 90 at the point of transfer 120 during a decorating cycle. The infomation pertaining to the condition of the positioning means is in the form of the location of the Z axis in terms of the distance along the X axis and Y axis from a given reference point, in this instance the reference point being a home position which coincides with the intersection of the X and Y axes, or the origin of the orthogonal coordinates provided by the X and Y axes, and the angular position of the bottle 20 about the Z axis, as referenced to a starting or home position. As described above in connection with FIGS. 8 through 11, for any chosen point along the outer surface 22 there is a corresponding angular position of the bottle 20 about the Z axis and a corresponding location of the Z axis in terms of the X and Y axes. By choosing a plurality of points along the outer surface 22, information pertaining to each of the plurality of points will be utilized by microprocessor 140 to operate the apparatus through a complete decorating cycle, as follows.

Figure 13:
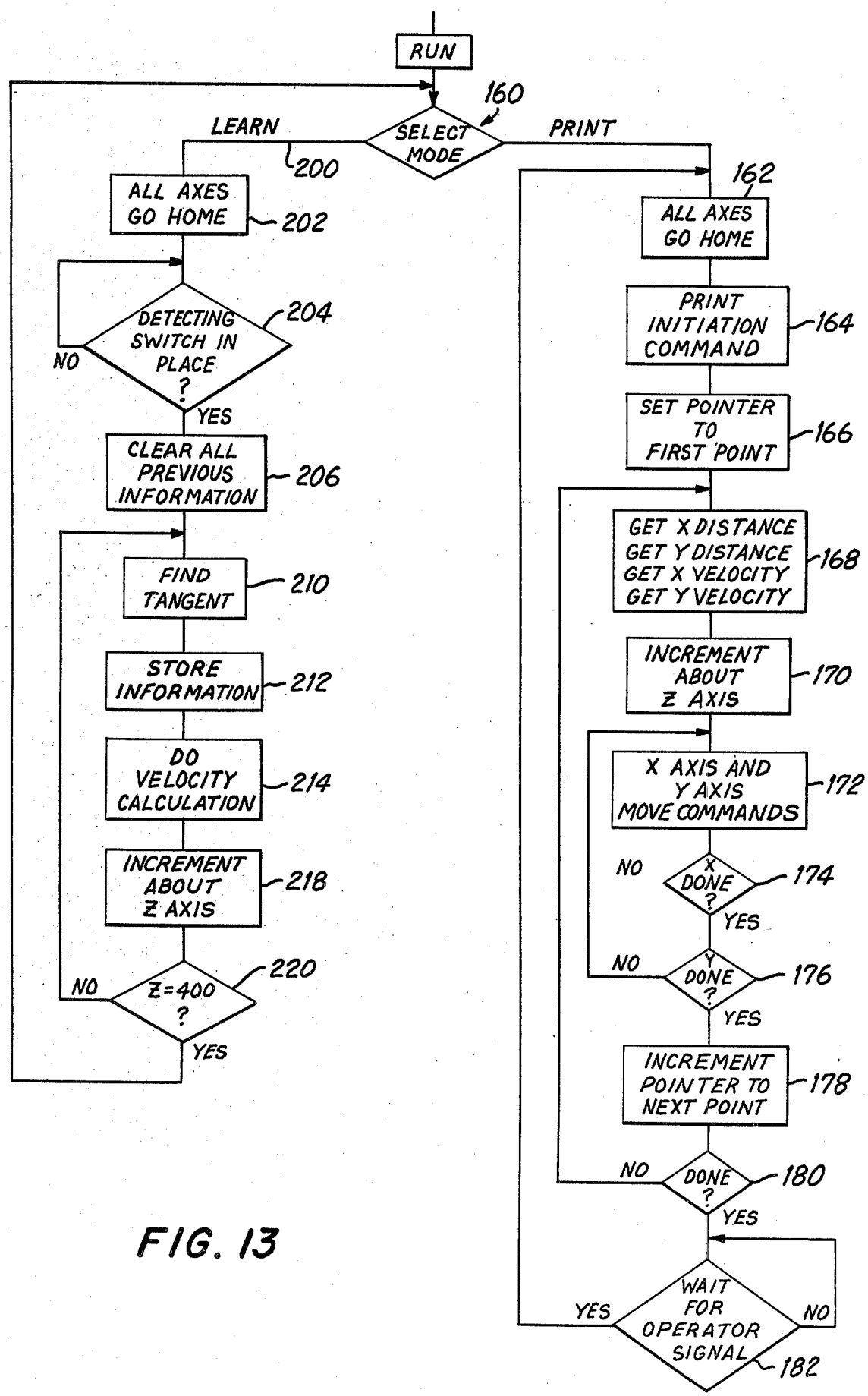
FIG. 13 is a flowchart illustrating the operation of the apparatus and method of the present invention.

Referring now to FIG. 13, as well as to FIG. 12, a program flowchart 160 illustrates the operation of the apparatus 30 through a decorating cycle. Preferably, drive motors 56, 62 and 74 are stepping motors and the position information for each point along the outer surface 22 of bottle 20 is furnished by the microprocessor 140 in terms of increments of movement of each drive motor, relative to the starting or home position, necessary to reach that point and place that point in the proper relative position and appropriate relative velocity at the point of transfer 120. The velocity information for each point also is supplied by the microprocessor 140 in terms of increments of movement within a specified time. In apparatus 30, microprocessor 140 is provided with position and velocity information for four hundred points along the outer surface 22 of bottle 20, corresponding to four hundred increments of rotation of the bottle about the Z axis, in a manner which will be explained in detail hereinafter. Suffice it to say at this juncture that for the given elliptical contour of outer surface 22 of bottle 20, microprocessor 140 is provided with information defining four hundred points spaced around the full perimeter of the elliptical cross-sectional configuration, corresponding to four hundred increments of rotation of the bottle 20 about the Z axis. While the number of increments of rotation is four hundred in the illustrated embodiment, the choice of the number of increments may be varied in accordance with the specific requirements of articles of various sizes and shapes.

Bottle 20 is placed manually within the chucking fixture 41 by an operator. The operator then selects the print mode, utilizing control arrangement 34, and the microprocessor 140 operates so that actuator 50 will clamp bottle 20 in place. Then, drive motors 56, 62 and 74 will be actuated to rotate the bottle about the Z axis and laterally translate the Z axis parallel to the X and Y axes until the home position is reached, if the components were not already in the home position, as indicated at block 162 of the flowchart 160. Once the bottle is in the home position, the program continues to operate the microprocessor 140 through a print initiation command 164 which actuates the squeegee control to move the squeegee downward into a print position at the point of transfer 120 and actutes drive motor 100 to commence movement of the screen 90 through the point of transfer 120, and a first point set command 166 sets an indexing pointer of the microprocessor to the memory location of the first of the four hundred points. Next, the position information and velocity information, in terms of distances and speeds along the X and Y directions, are obtained from the information provided to the microprocessor, as indicated at 168. The drive motor 56 then is actuated to rotate the bottle through one increment about the Z axis, as indicated at 170, and the drive motors 62 and 74 are actuated to move the Z axis to place the first point on the outer surface 22 in the proper relative position and at the appropriate relative velocity with respect to the squeegee 110 and the moving screen 90 at the point of transfer 120, as indicated at 172, 174 and 176. Upon completion of the appropriate movements of the Z axis, the pointer is incremented to the next point, as indicated at 178, and the routine for incrementing and moving the Z axis is repeated for the second point. The routine is repeated for each successive point until all four hundred points have been treated, as indicated at 180, and the decorating cycle is complete. The operator may then enter a signal, as shown at 182, to return all components to the home position, and start the program again for a subsequent bottle. It is pointed out that the increments of movement of the bottle relative to the Z, X and Y axes are so arranged in sequence that the total movement relative to each of the Z, X and Y axes takes place almost simultaneously, when viewed from the standpoint of the rate of transfer of the decorating medium at point of transfer 120.

As set forth above, apparatus 30 is capable of decorating articles of various cross-sectional configurations. All that is required is that microprocessor 140 be provided with information which will define the surface configuration of the particular article to be decorated, in terms of the positioning of the article relative to the X, Y and Z axes. In order to obtain the positional information for an article of a particular cross-sectional configuration, apparatus 30 is placed into a learning configuration and microprocessor 140 operates the apparatus in a learning mode, as follows.

Figure 14:
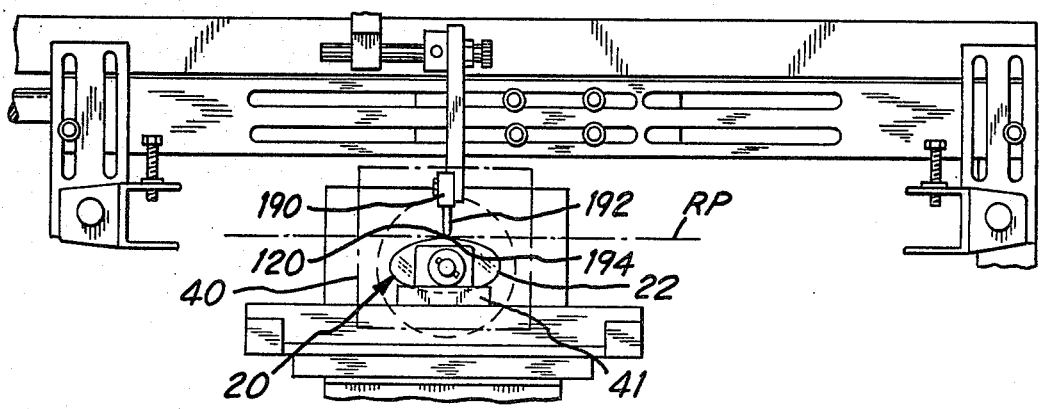
FIG. 14 is an enlarged fragmentary front elevational view of a portion of the apparatus arranged for a learning mode of operation.

Turning to FIG. 14, the screen 90 and squeegee 110 have been removed from the printing machine 32 and a detecting means, shown in the form of a simple electrical switch 190, has been mounted upon the printing machine 32 at the printing station 40. Switch 190 has a sensing probe 192, the tip 194 of which is located at the point of transfer 120. Again, for illustrative purposes, bottle 20 is placed in the chucking fixture 41, it being understood that the article placed in the chucking fixture may be of any one of various sizes and shapes and that the configuration of component parts of the chucking fixture may be modified accordingly to accommodate the various sizes and shapes.

With the switch 190 in place so that the tip 194 of probe 192 is biased toward the point of transfer 120, and with the bottle 20 in place within the chucking fixture 41 so that the tip 194 of probe 192 is biased against the outer surface 22 of bottle 20, microprocessor 140 is operated in the learning mode, as illustrated at 200 in FIG. 13. The operator selects the learning mode and the program proceeds to place the Z axis in the home position, at the origin of the X and Y axes, as illustrated by 202, if the Z axis is not already at home. The program then assures that the switch 190 is in place, as indicated at 204, before proceeding. Next, all previous information is cleared, as indicated at 206, and the program proceeds to obtain information pertaining to the cross-sectional configuration of bottle 20. For each one of the four hundred angular positions of the bottle 20 about the Z axis, the Z axis is translated laterally, in the direction of the X and Y axes, until the switch 190 indicates that a portion of the surface 22 of bottle 20 located at a point corresponding to that one angular position is tangent to reference plane RP (see FIG. 14), which is the plane of the screen 90, at the point of transfer 120. The particular sub-routine for determining the X and Y positional information defining each point of tangency corresponding to each angular position of the article about the Z axis, as indicated at 210, will be described in greater detail below. It is sufficient to note here that the positional information is stored, as shown by 212, and is then employed in a velocity calculation, as indicated by 214. The velocity calculation is based upon the differences in the X and Y distances, as well as the position of the Z axis, for consecutive points of tangency, the differences being a measure of the linear travel of the segment or portion of outer surface 22 which will pass the point of transfer 120 between the consecutive points of tangency. The amount of linear travel thus establishes the speed at which the Z axis must be displaced along the X and Y directions and the speed at which the bottle 20 is to be rotated about the Z axis in order to present a constant surface speed to the point of transfer during the print mode of operation. The velocity information is stored, together with the positional information. The bottle 20 is rotated in increments about the Z axis, as indicated at 218, to the next consecutive angular position and the routine is repeated, as noted at 220, until position and velocity information is stored for all four hundred angular positions about the Z axis. The stored information then utilized by the microprocessor to operate apparatus 30 in the print mode, as described above.

Figure 15:
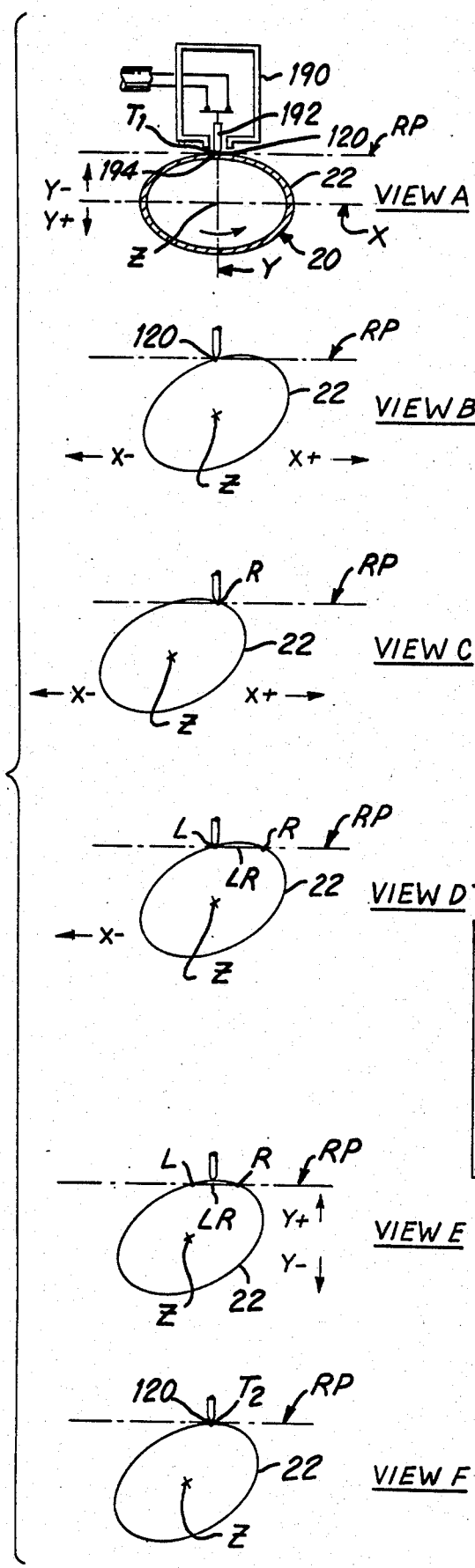
FIG. 15 is a series of diagrammatic illustrations showing the principles of operation of the apparatus and method of the present invention in the learning mode of operation.
Figure 16:
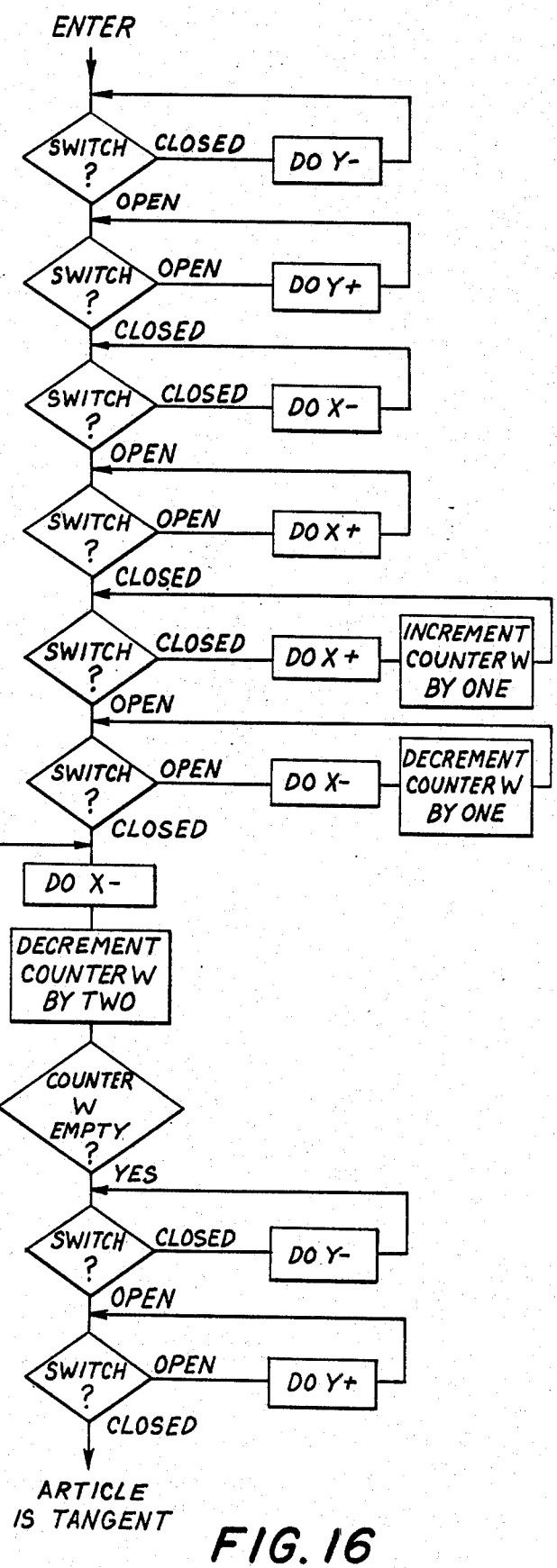
FIG. 16 is a flowchart illustrating a sub-routine in the learning mode of operation.

The particular sub-routine for determining the point of tangency so as to derive the position and velocity information for a particular cross-sectional configuration is illustrated in FIGS. 15 and 16. The sub-routine operates on the basis that for any angular position of the bottle 20 about the Z axis, the point on the outer surface 22 at which that surface will be tangent to the reference plane RP (the plane of the screen 90) is the point nearest to the reference plane (the highest point on the surface) and when that point is placed in coincidence with the point of transfer 120, the location of the Z axis, in terms of X and Y distances, will provide the required position information. By placing the tip 194 of plunger 192 of switch 190 at the point of transfer 120, the switch 190 will detect the coincidence of the point of tangency with the point of transfer 120, as follows.

As seen in FIG. 15, VIEW A, bottle 20 is in the home position with the Z axis at the origin of the X and Y axes and the tip 194 of plunger 192 of switch 190 placed at the point of transfer 120 and in contact with the outer surface 22 at point $T_1$ in reference plane RP. As stated above, the cross-sectional configuration of bottle 20 is an ellipse and, in the illustrated home position, outer surface 22 is tangent to plane RP at point $T_1$ and switch 190 is closed. Upon rotation of the bottle 20 about axis Z to the angular position shown in VIEW B of FIG. 15, the portion of surface 22 at the point of transfer 120 no longer is tangent to the plane RP. It then becomes necessary to move axis Z to a position where surface 22 once again becomes tangent with plane RP at point of transfer 120. The sub-routine for moving the Z axis to that position is illustrated in FIG. 16. Upon initiating the sub-routine, the drive motor 74 is actuated to move the Z axis downwardly (in the −Y direction), in counted increments, until switch 190 opens. Then the Z axis is moved upwardly (in the +Y direction) until switch 190 closes. Next, drive motor 62 is actuated to move the Z axis to the left, as viewed in FIG. 15 (in the −X direction), in counted increments, until switch 190 opens. Then, the Z axis is moved to the right (in the +X direction) until the switch 190 closes. At this stage, the tip 194 of plunger 192 is located at point R, to the right of the highest point of surface 22, as shown in VIEW C of FIG. 15. Next, the Z axis is moved to the right (in the +X direction) in increments which are counted by a separate counter W until switch 10 opens, and then is moved left again (in the −X direction) until the switch 190 closes. At this stage, the tip 194 of plunger 192 is located at point L, to the left of the highest point of surface 22, as illustrated in VIEW D of FIG. 15. Points L and R define a chord LR, the length of which is recorded in counter W. Now, the Z axis is moved to the left again (in the −X direction) while decrementing counter W by two for each increment of movement until counter W is emptied. In this manner, the midpoint of chord LR is located approximately at the point of transfer 120, as seen in VIEW E of FIG. 15. Since the midpoint of chord LR is aligned vertically essentially with the highest point of surface 22, the Z axis now is moved downwardly (in the −Y direction) until switch 190 opens and then is moved upwardly (in the +Y direction) until switch 190 closes, at which position the surface 22 is essentially tangent with plane RP at point $T_2$ which coincides with the point of transfer 120, as shown in VIEW F of FIG. 15. The position of the Z axis thus is determined in terms of X and Y distances. By repeating the sub-routine for each one of four hundred angular positions of the bottle 20 about the Z axis, sufficient position information is provided, in terms of X and Y distances, to define the surface contour of the cross-sectional configuration of bottle 20.

It is noted that the sub-routine approximates the location of point $T_2$ by virtue of the fact that chord LR is divided in half, but the segment of surface 22 lying between points L and R is not necessarily symmetrical about the midpoint of chord LR. The approximation becomes more and more accurate as the length of chord LR is decreased. Thus, a decrease in the magnitude of each increment of movement of the Z axis and an increase in the sensitivity of switch 190 will enable an even more accurate determination of the point of tangency $T_2$, for all practical purposes.

As will be seen from the above description, the position and velocity information for almost any configuration of article may be learned directly from the article itself and utilized with ease to enable the decoration of articles having a wide variety of shapes and sizes by printing, labelling or other techniques requiring the same relationship between an applicator and the article surface to be decorated. The information for each article may be generated and then utilized immediately for short or long runs or may be stored in an information storage device, as illustrated at 156, for future use. Because of the ability to learn almost any configuration, apparatus 30 is not limited to a relatively few configurations defined by mechanisms which rely upon expensive cams, levers or special gears. The ability of the apparatus to learn a surface configuration from the article itself reduces the necessity for adhering precisely to shapes and sizes specified in manufacturing drawings for different containers and compensates for greater dimensional tolerances. Since the learning and operating sequences are programmed for operation by microprocessor 140, apparatus 30 is easy to use and will provide consistent high quality even when operated by operators having only limited skill.

It is to be understood that the above detailed description of an embodiment of the invention is provided by way of example only. Various details of design and construction may be modified without departing from the true spirit and scope of the invention as set forth in the appended claims.

The embodiments of the invention in which an exclusive property or privilege is claimed are as follows:

1. Apparatus for decorating the surface of an article having a non-circular cross-sectional configuration, the apparatus including an applicator having a surface for applying a decorating medium to the article surface at a given location in the apparatus, at which given location the applicator surface and the article surface are maintained in proper relative position and appropriate relative velocity for the application of the decorating medium throughout a decorating cycle of operation, the apparatus comprising:

positioning means for positioning the article and the applicator at successive positions relative to one another during the decorating cycle such that successive portions of the article surface will be placed in the proper relative position and at the appropriate relative velocity with corresponding successive portions of the applicator surface, at the given location, throughout the decorating cycle, the positioning means including article drive means for advancing the successive portions of the article surface through the given location, and applicator drive means for advancing successive portions of the applicator surface through the given location, during the decorating cycle;

detecting means for detecting the successive positions of the article at which the successive portions of the article surface are placed in the proper relative position at the given location, based upon the cross-sectional configuration of the article, and for determining the condition of the positioning means when the article is at each of said successive positions so as to provide article-configuration information pertaining to the condition of the positioning means as determined by the surface contour of the cross-sectional configuration of the article;

information processing means for receiving said article-configuration information from the detecting means, and for providing operating information for actuation of the positioning means; and actuating means for actuating the positioning means in accordance with the operating information provided by the information processing means to actuate the article drive means and the applicator drive means such that the proper relative position and the appropriate relative velocity are maintained between the article surface and the applicator surface, at the given location, throughout the decorating cycle;

the article drive means including rotating means for rotating the article about a longitudinal first axis, relative to a corresponding home position; and translating means for translating the first axis laterally in directions perpendicular to the first axis, relative to a further corresponding home position; such that the condition of the positioning means when the article is at each of the successive positions is determined at least partly by the angular position of the article about the first axis and the location of the first axis, relative to the corresponding home positions; and the translating means including first moving means for moving the first axis along directions parallel to a second axis; and second moving means for moving the first axis along directions parallel to a third axis;

the first, second and third axes being mutually perpendicular such that the condition of the positioning means when the article is at each of the successive positions is determined at least partly by the location of the first axis relative to the second and third axes.

2. The invention of claim 1 wherein:

the rotating means includes first incremental drive means for rotating the article in fixed increments of rotation;

the first moving means includes second incremental drive means for moving the first axis in fixed increments of movement; and the second moving means includes third incremental drive means for moving the first axis in fixed increments of movement;

the increments of rotation being related to the successive positions of the article such that for each successive position of the article, the condition of the positioning means is identified by the number of increments of rotation and the number of increments of movement of the first axis relative to the second and third axes.

3. The invention of claim 1 or 2 wherein the given location is a point of transfer at which the applicator surface and the article surface are tangent and are at essentially zero relative velocity, and the detecting means includes a tangent detector located at the point of transfer for detecting tangency of the successive portions of the article surface relative to the applicator surface at the point of transfer.

4. The invention of claim 3 wherein the tangent detector is a switch.

5. The invention of claim 4 wherein the information processing means is a microprocessor.

6. Apparatus for decorating the surface of an article having a non-circular cross-sectional configuration, the apparatus including an applicator having a surface for applying a decorating medium to the article surface at a given location in the apparatus, at which given location the applicator surface and the article surface are maintained in proper relative position and appropriate relative velocity for the application of the decorating medium throughout a decorating cycle of operation, the apparatus comprising:

positioning means for positioning the article and the applicator at successive positions relative to one another during the decorating cycle such that successive portions of the article surface will be placed in the proper relative position and at the appropriate relative velocity with corresponding successive portions of the applicator surface, at the given location, throughout the decorating cycle, the positioning means including article drive means for advancing the successive portions of the article surface through the given location, and applicator drive means for advancing the successive portions of the applicator surface through the given location, during the decorating cycle;

article-configuration information means for providing information pertaining to the successive positions of the article at which the successive portions of the article surface are placed in the proper relative position at the given location, based upon the cross-sectional configuration of the article, and for identifying the condition of the positioning means when the article is at each of said successive positions so as to provide article-configuration information pertaining to the condition of the positioning means as determined by the cross-sectional configuration of the article;

information processing means for receiving the article-configuration information from the article-configuration information means and for providing operating information for actuation of the positioning means; and actuating means for actuating the positioning means in accordance with the operating information provided by the information processing means to actuate the article drive means and the applicator drive means such that the proper relative position and the appropriate relative velocity are maintained between the article surface and the applicator surface, at the given location, throughout the decorating cycle;

the article drive means including rotating means for rotating the article about a longitudinal first axis, relative to a corresponding home position; and translating means for translating the first axis laterally in directions perpendicular to the first axis, relative to a further corresponding home position; such that the condition of the positioning means when the article is at each of the successive positions is determined at least partly by the angular position of the article about the first axis and the location of the first axis, relative to the corresponding home positions; and the translating means including first moving means for moving the first axis along directions parallel to a second axis; and second moving means for moving the first axis along directions parallel to a third axis;

the first, second and third axes being mutually perpendicular such that the condition of the positioning means when the article is at each of the successive positions is determined at least partly by the location of the first axis relative to the second and third axes.

7. The invention of claim 6 wherein:

the rotating means includes first incremental drive means for rotating the article in fixed increments of rotation;

the first moving means includes second incremental drive means for moving the first axis in fixed increments of movement; and the second moving means includes third incremental drive means for moving the first axis in fixed increments of movement;

the increments of rotation being related to the successive positions of the article such that for each successive position of the article the condition of the positioning means is identified by the number of increments of rotation and the number of increments of movement of the first axis relative to the second and third axes.

8. The invention of claims 6 or 7 wherein the article-configuration information means includes a program storage means for storing the article-configuration information for selective use by the information processing means.

9. The invention of claim 8 wherein the information processing means is a microprocessor.

10. The method of decorating the surface of an article having a non-circular cross-sectional configuration and utilizing an apparatus which includes an applicator having a surface at a given location in the apparatus, at which given location the applicator surface and the article surface are maintained in proper relative position and appropriate relative velocity for the application of the decorating medium throughout a decorating cycle of operation, the method comprising the steps of:

positioning the article and the applicator at successive positions relative to one another such that successive portions of the article surface will be placed in the proper relative position with corresponding successive portions of the applicator surface, at the given location, for the decorating cycle;

detecting the successive positions of the article at which the successive portions of the article surface are placed in the proper relative position at the given location, based upon the cross-sectional configuration of the article, to provide article-configuration information determined by the cross-sectional configuration of the article; and advancing the successive portions of the article surface and the successive portions of the applicator surface through the given location in accordance with the article-configuration information such that the proper relative position and the appropriate relative velocity are maintained between the article surface and the applicator surface, at the given location, throughout the decorating cycle;

the step of positioning the article and the applicator at successive positions including rotating the article about a longitudinal first axis relative to a corresponding home position; and translating the first axis laterally in directions perpendicular to the first axis relative to a further home position; such that each said successive position of the article is defined at least partly by the angular position of the article about the first axis, and the location of the first axis, relative to the corresponding home positions; and the first axis is translated along directions parallel to a second axis;

the first axis is translated along further directions parallel to a third axis;

the first, second and third axes being mutually perpendicular such that each successive position of the article is defined at least partly by the location of the first axis relative to the second and third axes.

11. The invention of claim 10 wherein:
the article is rotated in fixed increments of rotation;
the first axis is translated along the directions parallel to the second axis in fixed increments of translation;
the first axis is translated along the further directions parallel to the third axis in fixed increments of translation;
the increments of rotation being related to the successive positions of the article such that each successive position is defined by the number of increments of rotation, and the number of increments of translation relative to the second and third axes.

12. The invention of claim 10 or 11 wherein the given location is a point of transfer at which the applicator surface and the article surface are tangent and are at essentially zero relative velocity and the step of detecting the successive positions of the article includes detecting the tangency of the successive portions of the article surface relative to the applicator surface at the point of transfer.

13. The invention of claim 12 including the step of storing the article-configuration information for selective subsequent use in the advancing step.

14. In the method of decorating the surface of an article having a non-circular cross-sectional configuration and utilizing an apparatus which includes an applicator having a surface for applying a decorating medium to the article surface at a given location in the apparatus, at which given location the applicator surface and the article surface are maintained in proper relative position and appropriate relative velocity for the application of the decorating medium throughout a decorating cycle of operation, the steps of:

positioning the article and the applicator at successive positions relative to one another such that successive portions of the article surface will be placed in the proper relative position with corresponding successive portions of the applicator surface, at the given location, for the decorating cycle;

detecting the successive positions of the article at which the successive portions of the article surface are placed in the proper relative position at the given location, based upon the cross-sectional configuration of the article, to provide article-configuration information determined by the cross-sectional configuration of the article; and storing the article-configuration information for selective subsequent use in advancing the successive portions of the article surface and the successive portions of the applicator surface throughout the decorating cycle;

the step of positioning the article and the applicator at successive positions including rotating the article about a longitudinal first axis relative to a corresponding home position; and translating the first axis laterally in directions perpendicular to the first axis relative to a further home position; such that each said successive position of the article is defined at least partly by the angular position of the article about the first axis, and the location of the first axis, relative to the corresponding home positions; and the first axis is translated along directions parallel to a second axis;

the first axis is translated along further directions parallel to a third axis;

the first, second and third axes being mutually perpendicular such that each successive position of the article is defined at least partly by the location of the first axis relative to the second and third axes.

15. The invention of claim 14 wherein:
the article is rotated in fixed increments of rotation;

the first axis is translated along the directions parallel to the second axis in fixed increments of translation;

the first axis is translated along the further directions parallel to the third axis in fixed increments of translation;

the increments of rotation being related to the successive positions of the article such that each successive position is defined by the number of increments of rotation, and the number of increments of translation relative to the second and third axes.

16. The invention of claim 14 or 15 wherein the given location is a point of transfer at which the applicator surface and the article surface are tangent and are at essentially zero relative velocity and the step of detecting the successive positions of the article includes detecting the tangency of the successive portions of the article surface relative to the applicator surface at the point of transfer.

* * * * *